(12) United States Patent
Klee et al.

(10) Patent No.: US 11,500,036 B2
(45) Date of Patent: Nov. 15, 2022

(54) METHOD FOR RECOGNIZING CONTACTING ERRORS IN A RECHARGEABLE BATTERY PACK, AND SYSTEM FOR CARRYING OUT THE METHOD

(71) Applicant: Robert Bosch GmbH, Stuttgart (DE)

(72) Inventors: Christoph Klee, Stuttgart (DE); Marc-Alexandre Seibert, Stuttgart (DE); Patrick Roeder, Herrenberg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/262,994

(22) PCT Filed: Jul. 12, 2019

(86) PCT No.: PCT/EP2019/068816
§ 371 (c)(1),
(2) Date: Jan. 25, 2021

(87) PCT Pub. No.: WO2020/043385
PCT Pub. Date: Mar. 5, 2020

(65) Prior Publication Data
US 2021/0165054 A1 Jun. 3, 2021

(30) Foreign Application Priority Data
Aug. 29, 2018 (DE) .......................... 102018214612.8

(51) Int. Cl.
*G01R 31/66* (2020.01)
*G01R 31/389* (2019.01)
(Continued)

(52) U.S. Cl.
CPC ............... *G01R 31/66* (2020.01); *G01K 7/22* (2013.01); *G01R 31/374* (2019.01);
(Continued)

(58) Field of Classification Search
None
See application file for complete search history.

(56) References Cited

U.S. PATENT DOCUMENTS 6,268,710 B1 * 7/2001 Koga .................. G01R 31/396
320/162
6,420,851 B1 * 7/2002 Schoofs ............. G01R 31/3648
320/132
(Continued)

FOREIGN PATENT DOCUMENTS

DE 102014221272 A1 4/2016
DE 102017115785 A1 3/2018
(Continued)

OTHER PUBLICATIONS

International Search Report for PCT/EP2019/068816, dated Jan. 17, 2020.

*Primary Examiner* — Jas A Sanghera
(74) *Attorney, Agent, or Firm* — Norton Rose Fulbright US LLP; Gerard Messina

(57) ABSTRACT

A method for recognizing contacting errors in a rechargeable battery pack. Each rechargeable battery of the rechargeable battery pack is connected in parallel to at least one further rechargeable battery of the rechargeable battery pack. The method includes: applying at least one current to the rechargeable battery pack; ascertaining at least one voltage that is present at the rechargeable battery pack, as a function of the applied current; determining at least one parameter based on the ascertained voltage; and comparing the parameter to a comparison variable.

16 Claims, 3 Drawing Sheets

(51) Int. Cl.
  *G01R 31/3835* (2019.01)
  *G01R 31/374* (2019.01)
  *G01K 7/22* (2006.01)
  *H01M 10/48* (2006.01)

(52) U.S. Cl.
  CPC ....... *G01R 31/389* (2019.01); *G01R 31/3835* (2019.01); *H01M 10/482* (2013.01); *H01M 10/486* (2013.01)

(56) References Cited

U.S. PATENT DOCUMENTS

| | | | | |
|---|---|---|---|---|
| 2005/0134232 | A1* | 6/2005 | Yamamoto | H02H 7/18 320/150 |
| 2007/0200567 | A1* | 8/2007 | Mizuno | G01R 31/3648 324/430 |
| 2009/0202890 | A1* | 8/2009 | Takeda | H01M 50/572 429/62 |
| 2012/0004875 | A1* | 1/2012 | Maeda | H01M 10/48 702/63 |
| 2013/0063094 | A1 | 3/2013 | Gibbs et al. | |
| 2014/0197803 | A1* | 7/2014 | Ishikawa | H02J 7/0029 320/150 |
| 2017/0370995 | A1* | 12/2017 | Huang | G01R 31/374 |
| 2018/0191037 | A1* | 7/2018 | Oh | H01M 10/441 |
| 2019/0379089 | A1* | 12/2019 | Kim | H02J 7/00 |

FOREIGN PATENT DOCUMENTS

| | | |
|---|---|---|
| EP | 3035067 A1 | 6/2016 |
| WO | 9010334 A1 | 9/1990 |

* cited by examiner

METHOD FOR RECOGNIZING CONTACTING ERRORS IN A RECHARGEABLE BATTERY PACK, AND SYSTEM FOR CARRYING OUT THE METHOD

FIELD

The present invention relates to a method for recognizing contacting errors in a rechargeable battery pack, a rechargeable battery pack, an electrical device, and a system for carrying out the method.

BACKGROUND INFORMATION

An electrical device is often operated using repeatedly usable rechargeable batteries that discharge in the electrical device and that may be recharged using a charging device. It is customary to connect a plurality of rechargeable batteries to form a rechargeable battery pack. The connection of the rechargeable batteries may take place with the aid of cell connectors, which are made of metal and typically welded to the rechargeable batteries.

A rechargeable battery pack must be operated within a certain specification window pertaining, for example, to a temperature, a charging current, a discharging current, and a charging voltage. For example, the charging voltage of a single rechargeable battery or of a plurality of rechargeable batteries connected to one another in parallel is monitored according to the IEC 62841 standard to ensure that the charging does not take place at an excessively high charging voltage. In addition, when discharging a rechargeable battery it must be ensured that the voltage does not fall below a certain cutoff voltage, which could permanently damage the rechargeable battery.

During use of electrical devices, mechanical stresses and vibrations may occur which may damage the cell connectors and/or their weld points. If this results in a rechargeable battery being electrically disconnected from the array of rechargeable batteries, for example the current may be distributed over a reduced number of rechargeable batteries. As a result, the remaining rechargeable batteries may possibly be operated outside their specification window. This may in turn result in damage to the remaining rechargeable batteries, and may possibly result in a hazard due to the damage. In addition, there is a risk that harmful overheating may occur in the event of a damaged weld point. The reason is high-impedance contacting between a rechargeable battery and a cell connector due to the damaged weld point.

A voltage measuring device for measuring a voltage of a battery is described in German Patent Application No. DE 10 2017 115 785 A1. The voltage measuring device includes a voltage measuring module, a protective circuit, a discharge circuit, and low pass filters. The protective circuit is situated between the battery and the discharge circuit and between the battery and the low pass filters. The voltage measuring module measures a first voltage that is present between two low pass filters, and a second voltage that is present between two terminals of the discharge circuit. The first voltage corresponds to a voltage that is present at the battery, reduced by an internal resistance of the protective circuit. The second voltage is a correction voltage. The voltage that is actually present at the battery may be ascertained from the measured voltages. If the voltage present at the battery has an unusual value, a safety mechanism is activated.

A method for recognizing contacting errors in a battery pack is described in European Patent Application No. EP 3 035 067 A1. A voltage difference detector measures a voltage that is present between a cell connector and a communication wire for the communication of transmitter/receiver units. If the voltage difference detector ascertains a voltage that is above a threshold value, a defective cell connector is assumed.

SUMMARY

An object of the present invention is to provide a method for recognizing contacting errors in a rechargeable battery pack, and a rechargeable battery pack, an electrical device, and a system for carrying out the method. This object may achieved by a method for recognizing contacting errors in a rechargeable battery pack, a rechargeable battery pack, an electrical device, and a system for carrying out the method in accordance with the present invention. Advantageous refinements of the present invention are described herein.

A method for recognizing contacting errors in a rechargeable battery pack, each rechargeable battery of the rechargeable battery pack being connected in parallel at least to a further rechargeable battery of the rechargeable battery pack, is provided. In accordance with an example embodiment of the present invention, the method includes the following method steps: Applying at least one current to the rechargeable battery pack. Ascertaining at least one voltage that is present at the rechargeable battery pack, as a function of the applied current. Determining at least one parameter based on the ascertained voltage. Comparing the parameter to a comparison variable.

The applied current may be a charging current or a discharging current. The charging current may be provided by an electrical tool that is designed as a charging device. The discharging current may be consumed by an electrical device that is designed as a tool, for example. The fact that each rechargeable battery of the rechargeable battery pack is connected in parallel at least to a further rechargeable battery of the rechargeable battery pack means that the rechargeable battery pack includes at least two rechargeable batteries that are connected in parallel. The rechargeable battery pack thus includes at least two sections over which a current may be distributed. If a rechargeable battery of one section is electrically disconnected from the array of rechargeable batteries, the number of sections of the rechargeable battery pack may be reduced. As a result, an increased current may flow across the remaining sections. This increased current may possibly be outside a permissible current value range for the rechargeable battery pack with fewer sections. This may result in damage to the rechargeable batteries in the remaining sections. The method advantageously allows the recognition of contacting errors in a multi-section rechargeable battery pack. This allows measures to be taken that protect the rechargeable battery pack from damage.

In one specific embodiment of the present invention, the parameter is an internal resistance of the rechargeable battery pack, and the comparison variable is a predefined internal resistance of the rechargeable battery pack. The internal resistance of the rechargeable battery pack advantageously changes when at least one rechargeable battery of the rechargeable battery pack is electrically disconnected from the array of rechargeable batteries. If the determined internal resistance differs from the predefined internal resistance of the rechargeable battery pack by an established threshold value, this may be interpreted as an electrical disconnection of a rechargeable battery.

In one specific embodiment of the present invention, the rechargeable battery pack is formed at least from two identical rechargeable battery groups. The parameter is an internal resistance of a first rechargeable battery group, and the comparison variable is an internal resistance of a second rechargeable battery group. The internal resistance of the first rechargeable battery pack advantageously changes when a rechargeable battery of the first rechargeable battery group is electrically disconnected from the first rechargeable battery group. If the determined internal resistance of the first rechargeable battery group differs from the determined internal resistance of the second rechargeable battery group by an established threshold value, this may be interpreted as an electrical disconnection of a rechargeable battery from the first rechargeable battery group.

In one specific embodiment of the present invention, the rechargeable battery pack is formed at least from two identical rechargeable battery groups. The parameter is a difference between two voltages that are present at a first rechargeable battery group, and the comparison variable is a difference between two voltages that are present at a second rechargeable battery group. The difference between the two voltages present at the first rechargeable battery group advantageously changes when at least one rechargeable battery is electrically disconnected from the first rechargeable battery group. If the difference between the two voltages present at the first rechargeable battery group differs from the difference between the two voltages present at the second rechargeable battery group by an established threshold value, this may be interpreted as an electrical disconnection of a rechargeable battery from a rechargeable battery group. A voltage that is present at a rechargeable battery group may be either a voltage during charging of the rechargeable battery pack or a voltage during discharging of the rechargeable battery pack. These voltages are to be referred to as charging voltages or as discharging voltages.

In one specific embodiment of the present invention, a temperature of the rechargeable battery pack is detected with the aid of a temperature sensor. When comparing the parameter to the comparison variable, a temperature dependency of the parameter is taken into account. As the result of taking the temperature dependency of the parameter into account, a change in the parameter due to temperature fluctuations advantageously does not necessarily have to be interpreted as a disconnection of a rechargeable battery from the rechargeable battery pack. In principle, the internal resistance of a rechargeable battery decreases with increasing temperature. The charging voltage decreases with increasing temperature.

In one specific embodiment of the present invention, the number of charging and discharging cycles of the rechargeable battery pack is detected. A dependency of the parameter on the number of charging and discharging cycles is taken into account when comparing the parameter to the comparison variable. As the result of taking into account the dependency of the parameter on the number of charging and discharging cycles, a change in the parameter due to aging processes in the rechargeable batteries of the rechargeable battery pack, which correlate with the number of charging and discharging cycles, advantageously does not necessarily have to be interpreted as an electrical disconnection of a rechargeable battery from the rechargeable battery pack. The internal resistance of a rechargeable battery increases with an increasing number of charging and discharging cycles. The charging voltage decreases with an increasing number of charging and discharging cycles.

In one specific embodiment of the present invention, a state of charge of the rechargeable battery pack is detected. A dependency of the parameter on the state of charge is taken into account when comparing the parameter to the comparison variable. As the result of taking into account the dependency of the parameter on the state of charge of the rechargeable battery pack, a change in the parameter due to an altered state of charge of the rechargeable battery pack advantageously does not necessarily have to be interpreted as an electrical disconnection of a rechargeable battery from the rechargeable battery pack. The internal resistance of a rechargeable battery decreases with increasing state of charge, while the charging voltage increases with increasing state of charge.

In one specific embodiment of the present invention, the method includes the following further method step: The rechargeable battery pack is blocked when the parameter differs from the comparison variable by an established threshold value. Damage to the rechargeable battery pack may advantageously be prevented by blocking the rechargeable battery pack when the rechargeable battery pack, for example, may no longer be operated within its specification window after a rechargeable battery of the rechargeable battery pack has been electrically disconnected from the array. Permanent blocking of the rechargeable battery pack is also advantageous, for example, when erratic contacting errors are present. For example, it is possible that in the event of a broken weld point, force-fit contact between a cell connector and a rechargeable battery of the rechargeable battery pack is still present, but is not reliable.

In one specific embodiment of the present invention, the blocking of the rechargeable battery pack takes place in that a temperature sensor of the rechargeable battery pack is influenced in such a way that a temperature of the rechargeable battery pack outside a permissible operating temperature range of the rechargeable battery pack is detected, and further use of the rechargeable battery pack is prevented by a controller. The controller may, for example, be a microcontroller of an electrical device or a microcontroller of the rechargeable battery pack. The electrical device may be a charging device or an electrical tool, for example.

In one specific embodiment of the present invention, the temperature sensor is designed as a thermistor. The influencing of the temperature sensor within the scope of the blocking of the rechargeable battery pack takes place in that a fuse connected in series to the temperature sensor is acted on by a voltage that is supercritical for the fuse.

In one specific embodiment of the present invention, the temperature sensor is designed as a thermistor. The influencing of the temperature sensor within the scope of the blocking of the rechargeable battery pack takes place in that a first switch connected in series to the temperature sensor is opened.

The variant for blocking the rechargeable battery pack, in which the temperature sensor is influenced by opening the first switch, provides the advantage that unblocking the rechargeable battery pack may take place easily without having to replace a fuse.

In one specific embodiment of the present invention, the method includes the following further method step: The rechargeable battery pack is unblocked. The unblocking of the rechargeable battery pack takes place in that the temperature sensor is influenced in such a way that a temperature of the rechargeable battery pack within the permissible operating temperature range of the rechargeable battery pack is detected, and the further use of the rechargeable battery pack is made possible by the controller. The unblocking of the rechargeable battery pack is meaningful, for example, when a rechargeable battery of the rechargeable battery pack has been electrically disconnected from the array, so that the rechargeable battery pack includes fewer sections, but the further use of the rechargeable battery pack is still possible. The further use of the rechargeable battery pack including fewer sections may take place, for example, with a reduced charging current.

In one specific embodiment of the present invention, the influencing of the temperature sensor takes place within the scope of the unblocking of the rechargeable battery pack by closing the first switch.

A rechargeable battery pack includes a plurality of rechargeable batteries. Each rechargeable battery of the rechargeable battery pack is connected in parallel at least to a further rechargeable battery of the rechargeable battery pack. The rechargeable battery pack includes a first terminal and a second terminal for connecting the rechargeable battery pack to an electrical device. The rechargeable battery pack includes at least one voltage measuring device, a first controller, a memory, and a temperature sensor. The first controller includes a third terminal for connecting the first controller to a second controller. The first controller is connected to the voltage measuring device and to the memory. The temperature sensor is provided for detecting a temperature of the rechargeable battery pack. The temperature sensor includes a fourth terminal for connecting the temperature sensor to the first controller or to the second controller. The voltage measuring device is designed to detect a voltage that is present at the rechargeable battery pack.

In one specific embodiment of the present invention, the temperature sensor is designed as a thermistor. The rechargeable battery pack includes a fuse that is connected in series to the thermistor. The fuse is connected to the first terminal or to the second terminal. The fuse connected in series to the thermistor allows the thermistor to be high-impedance in an interrupted state of the fuse. A temperature of the rechargeable battery pack outside the permissible operating temperature range of the rechargeable battery pack may be advantageously simulated in this way.

In one specific embodiment of the present invention, the temperature sensor is designed as a thermistor. The rechargeable battery pack includes a first switch that is connected in series to the thermistor. The first switch is connected to the first terminal or to the second terminal. The first switch includes a fifth terminal for connecting the first switch to the first controller. The first switch connected in series to the thermistor allows the thermistor to be high-impedance in an open state of the first switch. A temperature of the rechargeable battery pack outside the permissible operating temperature range of the rechargeable battery pack may be advantageously simulated in this way.

In accordance with an example embodiment of the present invention, an electrical device includes a current source or a current sink, a second controller, and a further voltage measuring device. The electrical device includes a sixth terminal and a seventh terminal for connecting the electrical device to a rechargeable battery pack. The current source or the current sink is connected to the sixth terminal and to the seventh terminal. The second controller is connected to the further voltage measuring device and to the current source or the current sink. The second controller includes an eighth terminal for connecting the second controller to a first controller. The further voltage measuring device is connected to the sixth terminal and to the seventh terminal.

In one specific embodiment of the present invention, the electrical device includes a second switch. The second switch includes a tenth terminal for connecting the second switch to a temperature sensor, an eleventh terminal for connecting the second switch to the sixth terminal or to the seventh terminal, and a twelfth terminal for connecting the second switch to the first controller or to the second controller. The second switch advantageously allows the temperature sensor of the rechargeable battery pack to be low-impedance in a closed state of the second switch, when the second switch is connected, for example, to the sixth terminal of the electrical device, and the temperature sensor of the rechargeable battery pack is connected to the second terminal of the rechargeable battery pack. A temperature of the rechargeable battery pack outside the permissible operating temperature range of the rechargeable battery pack may thus be simulated. Alternatively, the second switch may be provided for acting on the fuse of the rechargeable battery pack, connected in series to the temperature sensor, with a supercritical voltage. In this case, the temperature sensor designed as a thermistor is high-impedance. The fuse is acted on by a voltage of the rechargeable battery pack when the second switch is connected, for example, to the sixth terminal of the electrical device, and the fuse is connected to the second terminal of the rechargeable battery pack. Alternatively, the fuse may also be acted on by a power supply voltage, using the second switch. In this case, the second switch is not connected to the sixth terminal or to the seventh terminal of the electrical device, and the fuse is not connected to the second terminal or to the first terminal of the rechargeable battery pack, but instead the second switch and the fuse are situated in series in a separate circuit that is acted on by the power supply voltage.

In accordance with an example embodiment of the present invention, a system for carrying out the method for recognizing contacting errors in a rechargeable battery pack includes a rechargeable battery pack and an electrical device. The rechargeable battery pack and the electrical device are connected to one another via the first terminal of the rechargeable battery pack and the sixth terminal of the electrical device, and via the second terminal of the rechargeable battery pack and the seventh terminal of the electrical device. The first controller of the rechargeable battery pack and the second controller of the electrical device are connected to one another via the third terminal of the first controller and the eighth terminal of the second controller.

The above-described properties, features, and advantages of the present invention as well as the manner in which they are achieved become more clearly and plainly understandable in conjunction with the following description of the exemplary embodiments, explained in greater detail with reference to the schematic illustrations of the figures.

DETAILED DESCRIPTION OF EXAMPLE EMBODIMENTS

Figure 1:
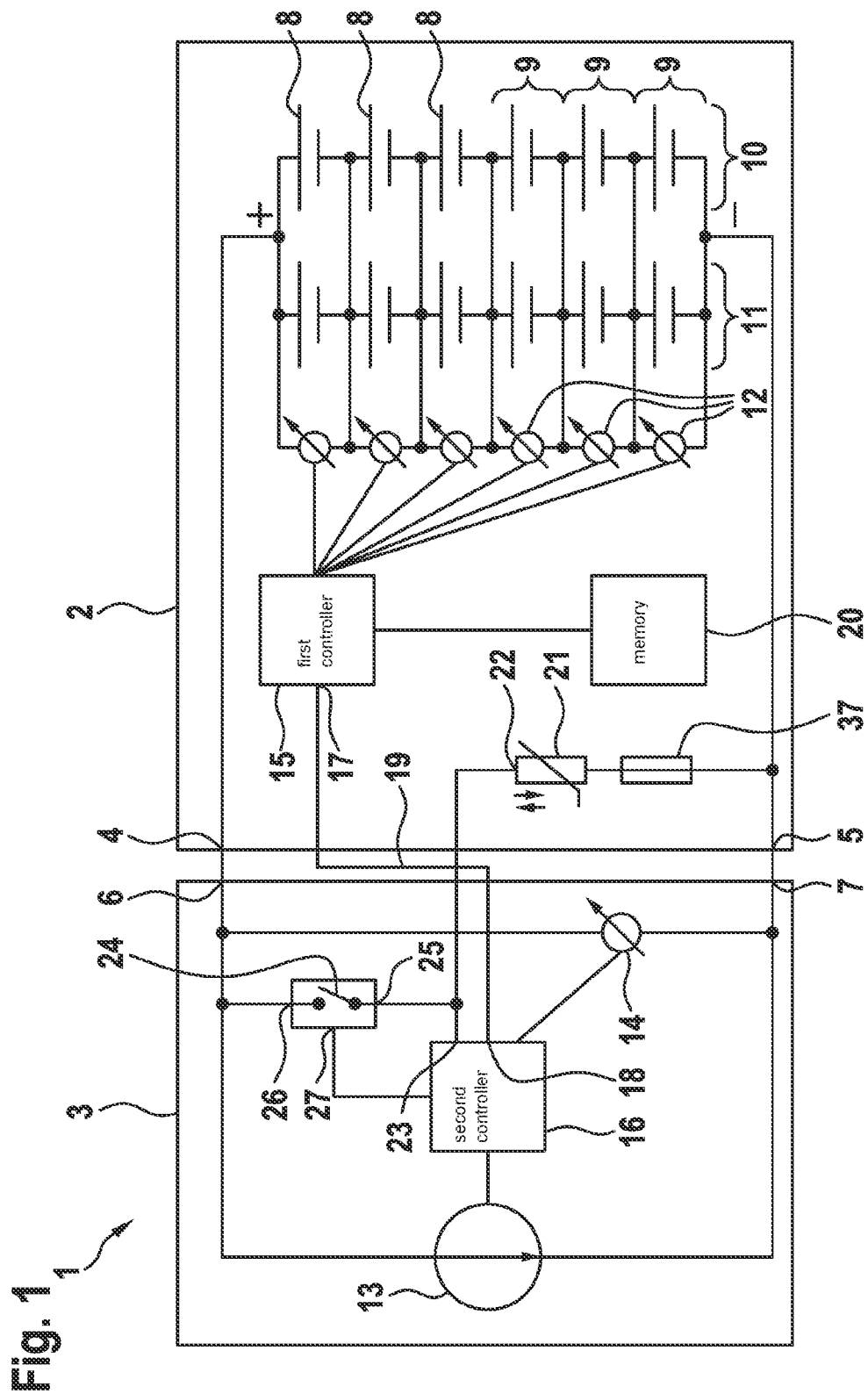
FIG. 1 shows a first system according to a first specific embodiment for carrying out a method for recognizing contacting errors in a rechargeable battery pack, in accordance with the present invention.

FIG. 1 schematically shows a first system 1 for carrying out a method for recognizing contacting errors in a rechargeable battery pack 2. In addition to rechargeable battery pack 2, first system 1 includes an electrical device 3.

Rechargeable battery pack 2 includes a first terminal 4 and a second terminal 5 for connecting rechargeable battery pack 2 to electrical device 3. Electrical device 3 includes a sixth terminal 6 and a seventh terminal 7 for connecting electrical device 3 to rechargeable battery pack 2. In first system 1, rechargeable battery pack 2 and electrical device 3 are connected to one another via first terminal 4 of rechargeable battery pack 2 and sixth terminal 6 of electrical device 3, and via second terminal 5 of rechargeable battery pack 2 and seventh terminal 7 of electrical device 3.

Rechargeable battery pack 2 includes a plurality of rechargeable batteries 8. Rechargeable batteries 8 may be designed, for example, as lithium-ion rechargeable batteries, lead rechargeable batteries, nickel-cadmium rechargeable batteries, or also as lithium-polymer rechargeable batteries. In the example illustration of FIG. 1, rechargeable battery pack 2 includes twelve rechargeable batteries 8. However, rechargeable battery pack 2 may also include a different number of rechargeable batteries 8. Rechargeable batteries 8 are connected to one another with the aid of cell connectors, the cell connectors themselves not being shown in FIG. 1 for the sake of simplicity. The cell connectors contain a metal and are typically welded to rechargeable batteries 8. In principle, via a series connection of rechargeable batteries 8 it is possible to increase a total voltage of rechargeable battery pack 2. In contrast, via a parallel connection of rechargeable batteries 8 it is possible to increase a total capacity of rechargeable battery pack 2.

Each rechargeable battery 8 of rechargeable battery pack 2 is connected in parallel at least to a further rechargeable battery 8 of rechargeable battery pack 2. In the example illustration of FIG. 1, in each case two rechargeable batteries 8 are connected to one another in parallel and form a rechargeable battery group 9. As an example, six rechargeable battery groups 9 having an identical design are connected in series. A rechargeable battery group 9 may also include an arbitrary number of rechargeable batteries 8 connected to one another in parallel. A rechargeable battery group 9 may also include rechargeable batteries 8 connected to one another in series. An arbitrary number of rechargeable battery groups 9 may also be connected to one another in series. Rechargeable battery pack 2 also does not necessarily have to include solely rechargeable battery groups 9 having an identical design. It is only necessary for each rechargeable battery 8 of rechargeable battery pack 2 to be connected in parallel at least to a further rechargeable battery 8 of rechargeable battery pack 2. This means that rechargeable battery pack 2 includes at least one first section 10 and one second section 11. However, rechargeable battery pack 2 may also include more than two sections 10, 11. If a rechargeable battery 8 of a section 10, 11 were electrically disconnected from the array of rechargeable batteries 8, rechargeable battery pack 2 would include only one of sections 10, 11, since in this case only one of sections 10, 11 would extend from the negative pole to the positive pole without interruption. Thus, if rechargeable battery pack 2 includes a plurality of sections 10, 11, and a rechargeable battery 8 is electrically disconnected from the array of rechargeable batteries 8 within a section 10, 11, the number of sections 10, 11 of rechargeable battery pack 2 may be reduced by one section 10, 11.

In the example illustration of FIG. 1, rechargeable battery pack 2 includes six voltage measuring devices 12. Voltage measuring devices 12 are connected to rechargeable batteries 8, and are designed to detect voltages that are present at rechargeable battery pack 2. Each voltage measuring device 12 is designed to detect a voltage that is present at a rechargeable battery group 9. However, rechargeable battery pack 2 may include an arbitrary number of voltage measuring devices 12. For example, if all rechargeable batteries 8 of first section 10 are connected in series, all rechargeable batteries 8 of second section 11 are connected in series, and first section 10 and second section 11 are connected in parallel, in each case a voltage measuring device 12 may be connected to a section 10, 11 and be designed to detect a voltage that is present at particular section 10, 11. If all rechargeable batteries 8 of a rechargeable battery group 9 are connected to one another in parallel, all rechargeable batteries 8 of this rechargeable battery group 9 are advantageously at the same electrical potential. The variant of the connection of rechargeable batteries 8 illustrated in FIG. 1 thus provides the advantage that the voltages that are detected by voltage measuring devices 12 and that are present at rechargeable battery groups 9 correspond to the voltages present at individual rechargeable batteries 8. However, voltage measuring devices 12 may also be dispensed with.

Electrical device 3 may, for example, be a charging device via which rechargeable battery pack 2 may be charged. However, electrical device 3 may also be an arbitrary electrical tool. Electrical device 3 may be a rechargeable battery screwdriver, for example, in which rechargeable battery pack 2 may be discharged by using the rechargeable battery screwdriver. Electrical device 3 includes a current source 13 or a current sink 13. If electrical device 3 is designed as a charging device, electrical device 3 includes current source 13. If electrical device 3 is designed as an electrical tool, electrical device 3 includes current sink 13. Current source 13 may provide, for example, a charging current for rechargeable battery pack 2. Current sink 13 may consume a discharging current of rechargeable battery pack 2. Current source 13 or current sink 13 is connected to sixth terminal 6 and to seventh terminal 7. Current source 13 or current sink 13 is connected to rechargeable batteries 8 of rechargeable battery pack 2 via first terminal 4 and second terminal 5 of rechargeable battery pack 2. In the example illustration of FIG. 1, the positive pole is situated at first terminal 4 and the negative pole is situated at second terminal 5, it also being possible to interchange the positive pole and the negative pole with one another.

Electrical device 3 includes a further voltage measuring device 14. Further voltage measuring device 14 is connected to sixth terminal 6 and to seventh terminal 7 of electrical device 3, and is designed to detect a voltage that is present between sixth terminal 6 and seventh terminal 7. Further voltage measuring device 14 is thus designed to detect a total voltage of rechargeable battery pack 2. However, further voltage measuring device 14 may also be dispensed with. Further voltage measuring device 14 of electrical device 3 may be dispensed with when rechargeable battery pack 2 includes at least one voltage measuring device 12. Conversely, voltage measuring devices 12 of rechargeable battery pack 2 may be dispensed with when electrical device 3 includes further voltage measuring device 14. First system 1 thus includes at least one voltage measuring device 12 or further voltage measuring device 14.

Rechargeable battery pack 2 includes a first controller 15. Electrical device 3 includes a second controller 16. First controller 15 and second controller 16 may be designed as microcontrollers, for example. First controller 15 of rechargeable battery pack 2 includes a third terminal 17 for connecting first controller 15 to second controller 16. Second controller 16 of electrical device 3 includes an eighth terminal 18 for connecting second controller 16 to first controller 15. First controller 15 and second controller 16 are connected to one another with the aid of a data line 19 that extends between third terminal 17 of first controller 15 and eighth terminal 18 of second controller 16. Electrical device 3 and rechargeable battery pack 2 may exchange data with one another bidirectionally via data line 19. It is also possible for first controller 15 and second controller 16 to communicate with one another wirelessly. In this case, third terminal 17, eighth terminal 18, and data line 19 may be dispensed with. First controller 15 of rechargeable battery pack 2 may also be dispensed with. First controller 15 of rechargeable battery pack 2 may be dispensed with when rechargeable battery pack 2 includes no voltage measuring devices 12.

Second controller 16 of electrical device 3 is connected to current source 13 or to current sink 13. Second controller 16 is designed to control current source 13 or current sink 13. If electrical device 3 is designed as a charging device, for example, second controller 16 may activate current source 13 in such a way that, for example, current source 13 provides rechargeable battery pack 2 with a fixed charging current. If electrical device 3 is thus designed as a charging device, second controller 16 of electrical device 3 may also be referred to as a charge regulator. If electrical device 3 is designed as an electrical tool, second controller 16 may, for example, set a fixed discharging current.

Rechargeable battery pack 2 includes a temperature sensor 21. Temperature sensor 21 is provided for detecting a temperature of rechargeable battery pack 2. Temperature sensor 21 may be designed as a thermistor, for example. Temperature sensor 21 designed as a thermistor may be an NTC thermistor or a PTC thermistor. As an example, temperature sensor 21 in FIG. 1 is depicted as an NTC thermistor. The hot carrier thermistor has a negative temperature coefficient (NTC), and thus has a better electrical conductivity in a warmer state than in a colder state. Temperature sensor 21 includes a fourth terminal 22 for connecting temperature sensor 21 to first controller 15 or to second controller 16. In the example illustration of FIG. 1, temperature sensor 21 is connected to second controller 16, and fourth terminal 22 of temperature sensor 21 is connected to a ninth terminal 23 of second controller 16. Second controller 16 is designed to ascertain a temperature of rechargeable battery pack 2 based on a temperature-dependent electrical resistance of temperature sensor 21. Alternatively, first controller 15 may also include ninth terminal 23 for connecting first controller 15 to temperature sensor 21, and may be designed to ascertain the temperature of rechargeable battery pack 2 based on the temperature-dependent electrical resistance of temperature sensor 21. Temperature sensor 21 may also be dispensed with.

Rechargeable battery pack 2 includes a memory 20. Memory 20 is designed as a nonvolatile memory and is connected to first controller 15 of rechargeable battery pack 2. Information that is provided to first controller 15 may be stored in memory 20 by first controller 15. Voltage measuring devices 12 of rechargeable battery pack 2 are connected to first controller 15 of rechargeable battery pack 2. Voltages that are ascertained by voltage measuring devices 12 may thus be stored in memory 20. In addition, the total voltage of rechargeable battery pack 2, ascertained by further voltage measuring device 14 of electrical device 3, may be stored in memory 20 via second controller 16 and via first controller 15. For this purpose, further voltage measuring device 14 is connected to second controller 16. If rechargeable battery pack 2 includes no voltage measuring devices 12 and no first controller 15, memory 20 of rechargeable battery pack 2 is connected to second controller 16 of electrical device 3.

First controller 15 and second controller 16 are designed to evaluate received information, so that, based on the voltages ascertained by voltage measuring devices 12 and further voltage measuring device 14, parameters may be ascertained which may allow a statement concerning whether contacting errors are present in rechargeable battery pack 2. The ascertained parameters may be stored in memory 20.

The parameters may be, for example, internal resistances of rechargeable batteries 8, internal resistances of rechargeable battery groups 9, an internal resistance of rechargeable battery pack 2, or differences between two voltages that are present at a rechargeable battery group 9. In addition, predefined internal resistances of rechargeable batteries 8, of rechargeable battery groups 9, and of rechargeable battery pack 2 may also be stored in the memory. This allows, for example, a comparison between ascertained and predefined internal resistances. Controllers 15, 16 are also designed to compare ascertained parameters to one another. It is also possible to store in memory 20 dependencies of the internal resistances of rechargeable batteries 8, of rechargeable battery groups 9, and of rechargeable battery pack 2, and dependencies of the voltages present at rechargeable batteries 8, at rechargeable battery groups 9, and at rechargeable battery pack 2, on the temperature of rechargeable battery pack 2, on the number of charging and discharging cycles of rechargeable battery pack 2, and on a state of charge of rechargeable battery pack 2.

Memory 20 is also provided for storing other information concerning rechargeable battery pack 2. The information stored in memory 20 may encompass, for example, information concerning the number of rechargeable batteries 8 of rechargeable battery pack 2 and their connection, information concerning the types of rechargeable batteries 8, and information concerning an end-of-charge voltage and a cutoff voltage of rechargeable battery pack 2. In addition, controller commands regarding rechargeable battery pack 2 may be stored in memory 20. For example, a piece of information that rechargeable battery pack 2 is blocked may be stored in memory 20. This information may be retrieved by first controller 15 and transmitted to second controller 16 of electrical device 3, so that second controller 16 prevents further use of rechargeable battery pack 2 via appropriate controller commands to current source 13 or current sink 13. The information that rechargeable battery pack 2 must be blocked may be determined based on a parameter that is ascertained by one of first controller 15 or second controller 16 and compared to a comparison variable, and stored in memory 20.

The blocking of rechargeable battery pack 2 is suitable, for example, when at least one rechargeable battery 8 of rechargeable battery pack 2 has been electrically disconnected from the array of rechargeable batteries 8. This may be caused, for example, by mechanical stresses during use of electrical device 3, thus damaging a weld point between a cell connector and a rechargeable battery 8. This may be identified, for example, by determining the internal resistance of rechargeable battery pack 2 as the parameter and comparing it to the predefined internal resistance of rechargeable battery pack 2, which in this case is the comparison variable. If the determined internal resistance differs from the predefined internal resistance by an established threshold value, this may be interpreted as an electrical disconnection of at least one rechargeable battery 8 from rechargeable battery pack 2.

If, for example, a rechargeable battery 8 of first section 10 is electrically disconnected from the array, the current can no longer be symmetrically distributed over first section 10 and second section 11, and instead flows across a single rechargeable battery 8 of second section 11. As a result, the remaining rechargeable battery 8 of rechargeable battery group 9, from which a rechargeable battery 8 has been electrically disconnected, may possibly no longer be operable within a specification window that is predefined for rechargeable battery 8. For example, remaining rechargeable battery 8 may still be operable only outside a permissible charging current value range, as the result of which remaining rechargeable battery 8 may be damaged and may cause a hazard. For this reason, the information that rechargeable battery pack 2 must be blocked is stored in memory 20.

Permanent blocking of rechargeable battery pack 2 is particularly advantageous for erratic contacting errors when in the event of a broken weld point, for example, a force-fit contact between a cell connector and a rechargeable battery 8 is still present, but is not reliable. There may also be a risk that in the event of a damaged weld point, harmful overheating may occur due to high-impedance contacting between a rechargeable battery 8 and a cell connector on account of the damaged weld point.

The blocking of rechargeable battery pack 2 may take place in various ways. FIG. 1 shows an example in which rechargeable battery pack 2 may be blocked in that temperature sensor 21 is influenced in such a way that a temperature of rechargeable battery pack 2 outside a permissible operating temperature range of rechargeable battery pack 2 is detected, and further use of rechargeable battery pack 2 is prevented by second controller 16 of electrical device 3. The temperature of rechargeable battery pack 2 is detected by second controller 16 of electrical device 3 based on the temperature-dependent electrical resistance of temperature sensor 21.

Rechargeable battery pack 2 includes a fuse 37 that is connected in series to temperature sensor 21 designed as a thermistor. Fuse 37 may be designed, for example, as a safety fuse or as some other current interrupt device (CID). Fuse 37 may be connected to either first terminal 4 or to second terminal 5. As an example, it is shown in FIG. 1 that fuse 37 is connected to second terminal 5. In addition, electrical device 3 includes a second switch 24. Second switch 24 may be designed as a transistor or as a relay, for example. Second switch 24 includes a tenth terminal 25 for connecting second switch 24 to temperature sensor 21. Second switch 24 includes an eleventh terminal 26 for connecting second switch 24 to sixth terminal 6 or to seventh terminal 7, second switch 24 in FIG. 1 being connected to sixth terminal 6 as an example, since fuse 37 is connected to second terminal 5 by way of example. It is also possible for second switch 24 to be connected to seventh terminal 7, and for fuse 37 to be connected to first terminal 4. Second switch 24 includes a twelfth terminal 27 for connecting second switch 24 to first controller 15 of rechargeable battery pack 2 or to second controller 16 of electrical device 3, FIG. 1 showing as an example the variant in which second switch 24 is connected to second controller 16 of electrical device 3 via twelfth terminal 27. As an example, second switch 24 is thus activated by second controller 16. Alternatively, second switch 24 may also be activated by first controller 15. In a closed state of second switch 24, the total voltage of rechargeable battery pack 2 is present at fuse 37, as the result of which fuse 37 may be severed. In one alternative variant, instead of the total voltage of rechargeable battery pack 2, a power supply voltage may be applied to fuse 37 with the aid of second switch 24. In this case, second switch 24 is not connected to sixth terminal 6, and fuse 37 is not connected to second terminal 5, but instead they are situated in series in a separate circuit that is acted on by the power supply voltage. If fuse 37 is interrupted, a high-impedance state of temperature sensor 21 designed as a thermistor is simulated. If temperature sensor 21 is an NTC thermistor, a low temperature of rechargeable battery pack 2 may thus be simulated. This low simulated temperature may be outside the permissible operating temperature range of rechargeable battery pack 2. Rechargeable battery packs 2 may typically be operated in a temperature value range of approximately 0° C. to 50° C. so that they incur no damage. Fuse 37 may also be dispensed with.

As an alternative to the high impedance of temperature sensor 21, a low impedance of temperature sensor 21 may also be simulated. In this variant, fuse 37 is dispensed with, so that temperature sensor 21 is connected to second terminal 5 when second switch 24 is connected to sixth terminal 6. Temperature sensor 21 is short-circuited in a closed state of second switch 24. If temperature sensor 21 designed as a thermistor is an NTC thermistor, a low impedance of temperature sensor 21 is thus simulated. In this case, a temperature of rechargeable battery pack 2 that is above a maximum permissible temperature of rechargeable battery pack 2 may be simulated. However, second switch 24 may also be dispensed with.

If temperature sensor 21 is connected to second controller 16 as shown in FIG. 1, second controller 16 may transmit to first controller 15 the information that the temperature of rechargeable battery pack 2 is outside the permissible operating temperature range, and first controller 15 may store the information in memory 20. This information may be retrieved by second controller 16 and used to block rechargeable battery pack 2 via appropriate controller commands to current source 13 or current sink 13.

If rechargeable battery pack 2 does not include a temperature sensor 21 or fuse 37, and electrical device 3 does not include a second switch 24, rechargeable battery pack 2 may also be blocked by second controller 16 preventing further use of rechargeable battery pack 2 when a certain parameter differs from a comparison variable by an established threshold value, and second controller 16 relaying appropriate controller commands to current source 13 or current sink 13.

Figure 2:
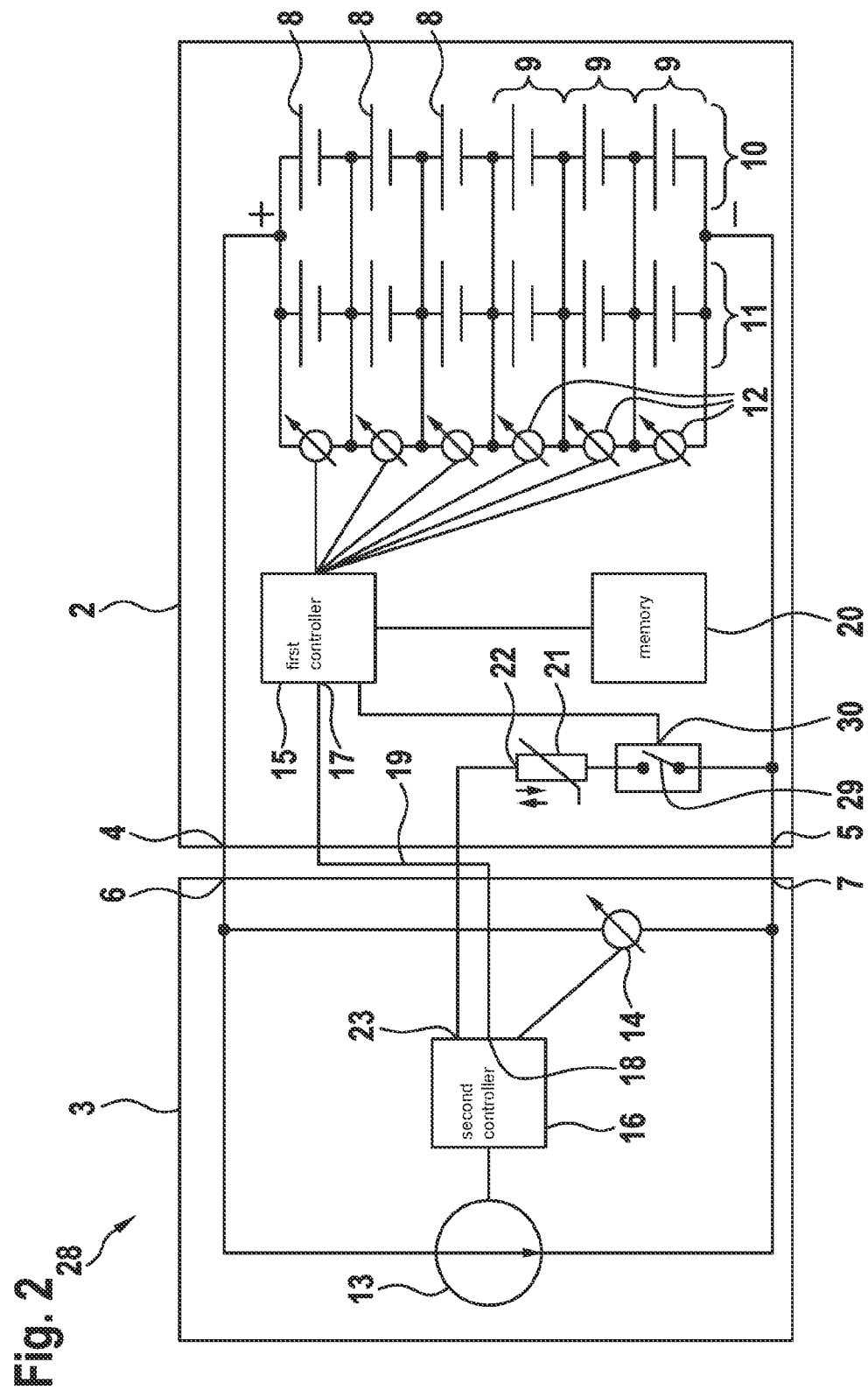
FIG. 2 shows a second system according to a second specific embodiment for carrying out the method, in accordance with the present invention.

FIG. 2 schematically shows a second system 28 according to a second specific embodiment for carrying out the method for recognizing contacting errors in a rechargeable battery pack 2. First system 1 and second system 28 are very similar. Elements having a similar or identical design are provided with the same reference numerals. Only the differences of second system 28 from first system 1 are explained below.

Second system 28 provides a further variant for simulating a temperature of rechargeable battery pack 2 that is outside the permissible operating temperature range. In this case, fuse 37 of rechargeable battery pack 2 and second switch 24 of electrical device 3 are dispensed with. Instead, rechargeable battery pack 2 includes a first switch 29 that may be designed as a transistor or relay, for example. First switch 29 is connected in series to temperature sensor 21 designed as a thermistor, and is connected to second terminal 5.

Alternatively, first switch 29 may also be connected to first terminal 4. First switch 29 includes a fifth terminal 30 for connecting first switch 29 to first controller 15. First switch 29 is connected to first controller 15 of rechargeable battery pack 2 and is activated by first controller 15. A high impedance of temperature sensor 21 is simulated in an open state of first switch 29. A piece of information that a contacting error is present in rechargeable battery pack 2 may be transmitted by first controller 15 to second controller 16. This piece of information may also be stored in memory 20 of rechargeable battery pack 2. If this is the case, first controller 15 may open first switch 29 based on the piece of information stored in memory 20 that a contacting error is present in rechargeable battery pack 2, and use of rechargeable battery pack 2 by electrical device 3 may be prevented by second controller 15. If rechargeable battery pack 2 is connected to a further electrical device, first controller 15 may open first switch 29 based on the piece of information stored in memory 20 that a contacting error is present in rechargeable battery pack 2, and use of rechargeable battery pack 2 by the further electrical device may be prevented by a further controller of the further electrical device. First switch 29 may also be dispensed with.

If rechargeable battery pack 2 includes no temperature sensor 21 and no first switch 29, rechargeable battery pack 2 may also be blocked by second controller 16 of electrical device 3 preventing further use of rechargeable battery pack 2 when a certain parameter differs from a comparison variable by an established threshold value, and second controller 16 relaying appropriate controller commands to current source 13 or current sink 13.

Rechargeable battery pack 2 of first system 1 or of second system 28 does not necessarily have to be continuously blocked when the number of sections 10, 11 of rechargeable battery pack 2 has been reduced, for example due to an electrical disconnection of a rechargeable battery 8. Alternatively, rechargeable battery pack 2 may also be used to a limited extent when rechargeable battery pack 2, despite the smaller number of sections 10, 11, may be operated, for example, within an adapted charging current value range. In this case, after the blocking of rechargeable battery pack 2, an unblocking of rechargeable battery pack 2 takes place for safety reasons if rechargeable battery pack 2 includes fewer sections than electrical device 3. A piece of information that rechargeable battery pack 2 includes fewer sections may be ascertained based on one of first controller 15 or second controller 16, and determined using a parameter that is compared to a comparison variable and stored in memory 20. This piece of information may be retrieved by first controller 15 and transmitted to second controller 16 of electrical device 3, so that second controller 16 allows use of rechargeable battery pack 2 via appropriate controller commands to current source 13 or current sink 13. For example, a charging current or a discharging current may then be adapted so that operation of rechargeable battery pack 2 with an adapted charging current or discharging current, for example with a reduced charging current or discharging current, is possible.

Figure 3:
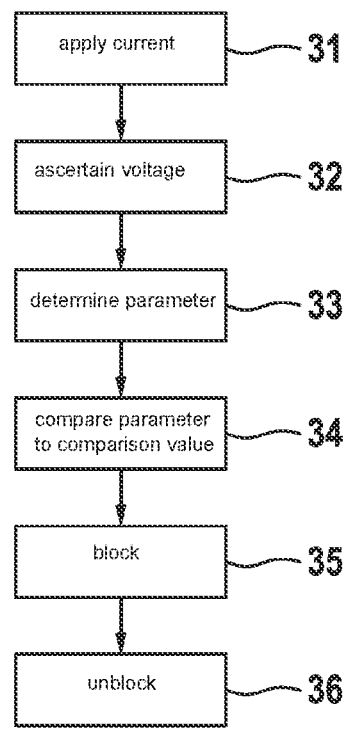
FIG. 3 shows the method for recognizing contacting errors in a rechargeable battery pack, in accordance with an example embodiment of the present invention.

FIG. 3 schematically shows method steps of the method for recognizing contacting errors in rechargeable battery pack 2, each rechargeable battery 8 of rechargeable battery pack 2 being connected in parallel at least to a further rechargeable battery 8 of rechargeable battery pack 2. The method may be carried out with the aid of first system 1 or with the aid of second system 28.

At least one current is applied to rechargeable battery pack 2 in a first method step 31. The current may be a charging current or a discharging current, for example, that is provided by current source 13 or consumed by current sink 13, respectively.

At least one voltage that is present at rechargeable battery pack 2 is ascertained in a second method step 32 as a function of the current that is present. The voltage may be, for example, the total voltage of rechargeable battery pack 2 ascertained by further voltage measuring device 14, or a voltage, present at rechargeable battery groups 9, that is ascertained by a voltage measuring device 12 of rechargeable battery pack 2.

At least one parameter is determined, based on the ascertained voltage, in a third method step 33. The parameter is compared to the comparison variable in a fourth method step 34.

The parameter may be, for example, the internal resistance of rechargeable battery pack 2. In this case, the comparison variable is a predefined internal resistance of rechargeable battery pack 2. The ascertained voltage is relayed from further voltage measuring device 14 of electrical device 3 to second controller 16. Second controller 16 ascertains the internal resistance of rechargeable battery pack 2 based on the ascertained voltage, and compares the ascertained internal resistance to the predefined internal resistance. The predefined internal resistance of rechargeable battery pack 2 may be stored in memory 20, for example. The predefined internal resistance of rechargeable battery pack 2 may also be provided to second controller 16 via a digital interface of rechargeable battery pack 2 or of electrical device 3, not shown in FIGS. 1 and 2. However, the predefined internal resistance of rechargeable battery pack 2 may also be stored in the form of a coding resistance in rechargeable battery pack 2. In this case, the coding resistance is measured by electrical device 3 with the aid of an arrangement not illustrated in FIGS. 1 and 2.

If rechargeable battery pack 2 is formed at least from two identical rechargeable battery groups 9, the parameter may also be a resistance of a first rechargeable battery group 9, and the comparison variable may be an internal resistance of a second rechargeable battery group 9. In this case, the voltages are ascertained by voltage measuring devices 12 of rechargeable battery pack 2 and provided to first controller 15 of rechargeable battery pack 2. First controller 15 ascertains the internal resistances of rechargeable battery groups 9 based on the ascertained voltages, and compares the ascertained internal resistances to predefined internal resistances of rechargeable battery groups 9 that are stored in memory 20 or provided via the interface. Thus, in this variant of the method the internal resistances of the individual rechargeable battery groups 9 are compared to one another.

When determining an internal resistance, it is advantageous when more than just one current is applied to rechargeable battery pack 2, and when more than just one voltage present at rechargeable battery pack 2 is ascertained as a function of the applied currents. This may improve the accuracy of the determination of the internal resistance. A first current may also be 0 ampere. In this case, an open circuit voltage is ascertained. It may advantageously be sufficient to ascertain only one voltage as a function of an applied current, in order to ascertain an internal resistance that is in good agreement with a predefined internal resistance. This is the case, for example, when a temperature, a state of charge, and the number of charging and discharging cycles are known and are taken into account when comparing the ascertained internal resistance to the predefined internal resistance.

For a rechargeable battery pack 2 that is formed at least from two identical rechargeable battery groups 9, a further option is to determine, as the parameter, a difference between two voltages that are present at a first rechargeable battery group, while the comparison variable is a difference between two voltages that are present at a second rechargeable battery group 9. In this case, the voltages that are present at rechargeable battery groups 9 are thus compared to one another by first controller 15. These may be charging voltages or discharging voltages that are present at rechargeable battery groups 9.

Detecting the temperature of rechargeable battery pack 2 with the aid of temperature sensor 21 provides the advantage that a temperature dependency of the parameter may be taken into account when comparing the parameter to the comparison variable. For example, a temperature dependency of the internal resistance of rechargeable battery pack 2 or of rechargeable battery groups 9 may be taken into account when comparing the ascertained internal resistance to the predefined internal resistance. This temperature dependency may be stored in memory 20, for example, or provided via the interface. In principle, the internal resistance of a rechargeable battery 8 decreases with increasing temperature. The charging voltage decreases with increasing temperature.

In addition, it is advantageous to take into account aging processes of rechargeable battery pack 2 when comparing the parameter to the comparison variable. This may take place, for example, by detecting the number of charging and discharging cycles of rechargeable battery pack 2, which correlate with an age of rechargeable battery pack 2. The number of charging and discharging cycles of rechargeable battery pack 2 may be detected by first controller 15 or by second controller 16 and taken into account when comparing the parameter to the comparison variable. A dependency of the parameter on the number of charging and discharging cycles may be stored in memory 20, for example, or provided via the interface. The internal resistance of a rechargeable battery 8 increases with an increasing number of charging and discharging cycles. The charging voltage decreases with an increasing number of charging and discharging cycles.

Furthermore, it is advantageous to detect a state of charge of rechargeable battery pack 2, and to take into account a dependency of the parameter on the state of charge of rechargeable battery pack 2 when comparing the parameter to the comparison variable. The dependency of the parameter on the state of charge may be stored in memory 20 or provided via the interface. The internal resistance of a rechargeable battery 8 decreases with increasing state of charge, while the charging voltage increases with increasing state of charge.

The blocking of rechargeable battery pack 2 takes place in an optional fifth method step 35 when the parameter differs from the comparison variable by an established threshold value. The dependency of the parameter on the temperature, on the number of charging and discharging cycles, and on the state of charge of rechargeable battery pack 2 is taken into account when checking whether the parameter differs from the comparison variable by the established threshold value. The blocking of rechargeable battery pack 2 may take place, for example, in that temperature sensor 21 is influenced in such a way that a temperature of rechargeable battery pack 2 outside the permissible operating temperature range of rechargeable battery pack 2 is detected, and the further use of rechargeable battery pack 2 is prevented by second controller 16 of electrical device 3. If temperature sensor 21 is designed as a thermistor, the influencing of temperature sensor 21 within the scope of the blocking of rechargeable battery pack 2 of first system 1 may take place in that fuse 37, connected in series to temperature sensor 21, is acted on by a voltage that is supercritical for fuse 37 by closing second switch 24. Alternatively, temperature sensor 21 designed as a thermistor may be short-circuited by closing second switch 24 when no fuse 37 is present. The influencing of temperature sensor 21 designed as a thermistor may take place within the scope of the blocking of rechargeable battery pack 2 of second system 28 by opening first switch 29, which is connected in series to temperature sensor 21.

The unblocking of rechargeable battery pack 2 takes place in an optional sixth method step 36. The unblocking of rechargeable battery pack 2 takes place in that temperature sensor 21 is influenced in such a way that a temperature of rechargeable battery pack 2 within the permissible operating temperature range of rechargeable battery pack 2 is detected, and the further use of rechargeable battery pack 2 is made possible by second controller 16 of electrical device 3. The influencing of temperature sensor 21 within the scope of the unblocking of rechargeable battery pack 2 of second system 28 may take place by once again closing first switch 29 after it has been opened within the scope of the blocking of rechargeable battery pack 2. The influencing of temperature sensor 21 within the scope of the unblocking of rechargeable battery pack 2 of first system 1 may take place by opening second switch 24 if temperature sensor 21 has previously been connected with low impedance by closing second switch 24. In this case, rechargeable battery pack 2 of first system 1 does not include a fuse 37. If fuse 37 is present, it must be replaced if it was previously severed, and second switch 24 must be placed in an open state in order to once again unblock rechargeable battery pack 2.

The present invention has been illustrated and described in detail with reference to the preferred exemplary embodiments. However, the present invention is not limited to the examples provided. Rather, other variations may be deduced by those skilled in the art without departing from the protective scope of the present invention.

What is claimed is:

1. A method for recognizing contacting errors in a rechargeable battery pack, each rechargeable battery of the rechargeable battery pack being connected in parallel at least to a further rechargeable battery of the rechargeable battery pack, the method comprising the following steps:
   applying at least one current to the rechargeable battery pack;
   ascertaining at least one voltage that is present at the rechargeable battery pack as a function of the applied current;
   determining at least one parameter based on the ascertained voltage; and
   comparing the parameter to a comparison variable,
   blocking the rechargeable battery pack when the parameter differs from the comparison variable by an established threshold value,
   wherein the blocking of the rechargeable battery pack takes place in that a temperature sensor of the rechargeable battery pack is influenced in such a way that a temperature of the rechargeable battery pack outside a permissible operating temperature range of the rechargeable battery pack is detected, and further use of the rechargeable battery pack is prevented by a controller,
   wherein the temperature sensor is a thermistor, and wherein the influencing of the temperature sensor within the scope of the blocking of the rechargeable battery pack takes place in that a fuse, connected in series to the temperature sensor, is acted on by a voltage that is supercritical for the fuse, unblocking the rechargeable battery pack, the unblocking of the rechargeable battery pack taking place in that the temperature sensor is influenced in such a way that a temperature of the rechargeable battery pack within the permissible operating temperature range of the rechargeable battery pack is detected, and the further use of the rechargeable battery pack is made possible by the controller.

2. The method as recited in claim 1, wherein the parameter is an internal resistance of the rechargeable battery pack, and the comparison variable is a predefined internal resistance of the rechargeable battery pack.

3. The method as recited in claim 1, wherein the rechargeable battery pack is formed at least from two identical rechargeable battery groups, the parameter being an internal resistance of a first rechargeable battery group of the battery groups, and the comparison variable being an internal resistance of a second rechargeable battery group of the battery groups.

4. The method as recited in claim 1, wherein the rechargeable battery pack is formed at least from two identical rechargeable battery groups, the parameter being a difference between two voltages that are present at a first rechargeable battery group of the battery groups, and the comparison variable being a difference between two voltages that are present at a second rechargeable battery group of the battery groups.

5. The method as recited in claim 1, wherein a temperature of the rechargeable battery pack is detected using a temperature sensor, and wherein a temperature dependency of the parameter is taken into account when comparing the parameter to the comparison variable.

6. The method as recited in claim 1, wherein a number of charging and discharging cycles of the rechargeable battery pack is detected, and wherein a dependency of the parameter on the number of charging and discharging cycles is taken into account when comparing the parameter to the comparison variable.

7. The method as recited in claim 1, wherein a state of charge of the rechargeable battery pack is detected, and wherein a dependency of the parameter on the state of charge is taken into account when comparing the parameter to the comparison variable.

8. The method as recited in claim 1, wherein the temperature sensor is a thermistor, and wherein the influencing of the temperature sensor within the scope of the blocking of the rechargeable battery pack takes place in that a first switch connected in series to the temperature sensor is opened.

9. The method as recited in claim 8, further comprising:
unblocking the rechargeable battery pack, the unblocking of the rechargeable battery pack taking place in that the temperature sensor is influenced in such a way that a temperature of the rechargeable battery pack within the permissible operating temperature range of the rechargeable battery pack is detected, and the further use of the rechargeable battery pack is made possible by the controller;
wherein the influencing of the temperature sensor within the scope of the unblocking of the rechargeable battery pack takes place by closing the first switch.

10. A rechargeable battery pack, comprising:
a plurality of rechargeable batteries, each rechargeable battery of the rechargeable battery pack being connected in parallel to at least one further rechargeable battery of the rechargeable battery pack;
a first terminal and a second terminal for connecting the rechargeable battery pack to an electrical device;
at least one voltage measuring device;
a first controller;
a memory; and
a temperature sensor;
wherein:
the first controller includes a third terminal to connect the first controller to a second controller,
the first controller is connected to the voltage measuring device and to the memory;
the temperature sensor is configured to detect a temperature of the rechargeable battery pack;
the temperature sensor includes a fourth terminal to connect the temperature sensor to the first controller or to the second controller; and
the voltage measuring device is configured to detect a voltage that is present at the rechargeable battery pack,
blocking the rechargeable battery pack when the parameter differs from the comparison variable by an established threshold value,
wherein the blocking of the rechargeable battery pack takes place in that a temperature sensor of the rechargeable battery pack is influenced in such a way that a temperature of the rechargeable battery pack outside a permissible operating temperature range of the rechargeable battery pack is detected, and further use of the rechargeable battery pack is prevented by a controller,
wherein the temperature sensor is a thermistor, and wherein the influencing of the temperature sensor within the scope of the blocking of the rechargeable battery pack takes place in that a fuse, connected in series to the temperature sensor, is acted on by a voltage that is supercritical for the fuse,
unblocking the rechargeable battery pack, the unblocking of the rechargeable battery pack taking place in that the temperature sensor is influenced in such a way that a temperature of the rechargeable battery pack within the permissible operating temperature range of the rechargeable battery pack is detected, and the further use of the rechargeable battery pack is made possible by the controller.

11. The rechargeable battery pack as recited in claim 10, wherein the temperature sensor is a thermistor, the rechargeable battery pack includes a fuse that is connected in series to the thermistor, and the fuse is connected to the first terminal or to the second terminal.

12. The rechargeable battery pack as recited in claim 10, wherein the temperature sensor is a thermistor, the rechargeable battery pack includes a first switch that is connected in series to the thermistor, the first switch is connected to the first terminal or to the second terminal, and the first switch includes a fifth terminal to connect the first switch to the first controller.

13. An electrical device, comprising:
a current source or a current sink;
a second controller;
a further voltage measuring device;
a sixth terminal and a seventh terminal to connect the electrical device to a rechargeable battery pack;
wherein:
the current source or the current sink is connected to the sixth terminal and to the seventh terminal;

the second controller is connected to the further voltage measuring device and to the current source or the current sink;

the second controller includes an eighth terminal to connect the second controller to a first controller; and the further voltage measuring device is connected to the sixth terminal and to the seventh terminal, blocking the rechargeable battery pack when the parameter differs from the comparison variable by an established threshold value, wherein the blocking of the rechargeable battery pack takes place in that a temperature sensor of the rechargeable battery pack is influenced in such a way that a temperature of the rechargeable battery pack outside a permissible operating temperature range of the rechargeable battery pack is detected, and further use of the rechargeable battery pack is prevented by a controller, wherein the temperature sensor is a thermistor, and wherein the influencing of the temperature sensor within the scope of the blocking of the rechargeable battery pack takes place in that a fuse, connected in series to the temperature sensor, is acted on by a voltage that is supercritical for the fuse, unblocking the rechargeable battery pack, the unblocking of the rechargeable battery pack taking place in that the temperature sensor is influenced in such a way that a temperature of the rechargeable battery pack within the permissible operating temperature range of the rechargeable battery pack is detected, and the further use of the rechargeable battery pack is made possible by the controller.

14. The electrical device as recited in claim 13, further comprising:

a second switch including a tenth terminal to connect the second switch to a temperature sensor;

an eleventh terminal to connect the second switch to the sixth terminal or to the seventh terminal; and a twelfth terminal to connect the second switch to the first controller or to the second controller.

15. A system, comprising:

a rechargeable battery pack including:
a plurality of rechargeable batteries, each rechargeable battery of the rechargeable battery pack being connected in parallel to at least one further rechargeable battery of the rechargeable battery pack,
a first terminal and a second terminal for connecting the rechargeable battery pack to an electrical device,
at least one voltage measuring device,
a first controller,
a memory, and
a temperature sensor,
wherein:
the first controller includes a third terminal to connect the first controller to a second controller,
the first controller is connected to the voltage measuring device and to the memory,
the temperature sensor is configured to detect a temperature of the rechargeable battery pack,
the temperature sensor includes a fourth terminal to connect the temperature sensor to the first controller or to the second controller, and
the voltage measuring device is configured to detect a voltage that is present at the rechargeable battery pack; and an electrical device including:
a current source or a current sink;
a second controller;
a further voltage measuring device;
a sixth terminal and a seventh terminal to connect the electrical device to the rechargeable battery pack;
wherein:
the current source or the current sink is connected to the sixth terminal and to the seventh terminal,
the second controller is connected to the further voltage measuring device and to the current source or the current sink,
the second controller includes an eighth terminal to connect the second controller to the first controller, and
the further voltage measuring device is connected to the sixth terminal and to the seventh terminal;

wherein the rechargeable battery pack and the electrical device are connected to one another via the first terminal of the rechargeable battery pack and the sixth terminal of the electrical device, and via the second terminal of the rechargeable battery pack and the seventh terminal of the electrical device, the first controller of the rechargeable battery pack and the second controller of the electrical device being connected to one another via the third terminal of the first controller and the eighth terminal of the second controller, blocking the rechargeable battery pack when the parameter differs from the comparison variable by an established threshold value, wherein the blocking of the rechargeable battery pack takes place in that a temperature sensor of the rechargeable battery pack is influenced in such a way that a temperature of the rechargeable battery pack outside a permissible operating temperature range of the rechargeable battery pack is detected, and further use of the rechargeable battery pack is prevented by a controller, wherein the temperature sensor is a thermistor, and wherein the influencing of the temperature sensor within the scope of the blocking of the rechargeable battery pack takes place in that a fuse, connected in series to the temperature sensor, is acted on by a voltage that is supercritical for the fuse, unblocking the rechargeable battery pack, the unblocking of the rechargeable battery pack taking place in that the temperature sensor is influenced in such a way that a temperature of the rechargeable battery pack within the permissible operating temperature range of the rechargeable battery pack is detected, and the further use of the rechargeable battery pack is made possible by the controller.

16. The system as recited in claim 15, wherein the system is configured to recognize contacting errors in the rechargeable battery pack, the system configured to:

apply at least one current to the rechargeable battery pack:

ascertain at least one voltage that is present at the rechargeable battery pack as a function of the applied current;

determine at least one parameter based on the ascertained voltage; and compare the parameter to a comparison variable.

\* \* \* \* \*